United States Patent [19]
Han et al.

[11] Patent Number: 5,454,900
[45] Date of Patent: Oct. 3, 1995

[54] DETAPING APPARATUS

[75] Inventors: Chin F. Han; Seng F. Lee, both of Singapore, Singapore

[73] Assignee: Telford Industries Pte Ltd., Singapore, Singapore

[21] Appl. No.: 288,069

[22] Filed: Aug. 10, 1994

[51] Int. Cl.⁶ .................................................. B32B 35/00
[52] U.S. Cl. ........................... 156/584; 156/344; 221/25; 221/72; 221/82; 414/405; 414/411
[58] Field of Search .................... 156/344, 584; 221/25, 72, 82; 226/5, 8, 52; 414/405, 411

[56] References Cited

U.S. PATENT DOCUMENTS

| | | | |
|---|---|---|---|
| 4,660,282 | 4/1987 | Pfaff | 221/73 X |
| 4,735,341 | 4/1988 | Hamilton et al. | 221/25 X |
| 5,268,059 | 12/1993 | Olson | 156/584 |
| 5,299,902 | 4/1994 | Fujiwara et al. | 221/25 X |

*Primary Examiner*—Mark A. Osele
*Attorney, Agent, or Firm*—Malina & Wolson

[57] ABSTRACT

An apparatus for removing both plastic leaded chip carrier and small outline package electronic components from carrier tapes includes a platform which supports the carrier tape and a drum which receives the cover tape which is peeled away from the carrier tape thereby releasing the electronic components. The electronic components slide under the influence of gravity along an adjustable guide into a collecting tube which has been clamped to the adjustable guide. The adjustable guide is capable of a position substantially perpendicular to the platform and a position substantially parallel to the platform thereby facilitating detaping of both plastic leaded chip carrier components and small outline package components.

15 Claims, 7 Drawing Sheets

DETAPING APPARATUS

BACKGROUND OF THE INVENTION

The present invention relates generally to equipment for the handling of electronic components and, more particularly, to a detaping apparatus for the removal of surface mount components from carrier tapes.

In the process for handling surface mount components known as "tape and reel" the surface mount components are inserted into pockets which are formed in a carrier tape and then a cover tape is applied over the components and heat sealed to the carrier tape thereby covering the components. The process of detaping involves the removal of the components from the carrier tape for reuse.

In the conventional manual detaping process, the carrier tape is cut into strips, each approximately six inches in length, using scissors. The cover tape is then peeled off by hand. The carrier tape is inverted allowing the surface mount components to fall onto a work surface. The operator then manually picks up the components one at a time and inserts them into a plastic tube.

Using the above manual process, an operator can pick up and insert approximately 1,000 surface mount components per hour. However, the manual handling of the surface mount components can cause physical damage to the components such as bending of the leads, which are relatively small and easily damaged, and the manual process can also cause functional damage resulting from electrostatic charges. In addition, corrosion and oxidation may begin to form on the components due to acid in sweat coming into contact with the components during the handling process.

The prior art also includes various attempts to automate the detaping process including the following U.S. Pat. Nos. 4,494,902 issued to Kuppenset et al.; 4,660,282 issued to Pfaff; 4,735,341 issued to Hamilton et al.; 4,738,386 issued to Itemadani et al.; 4,869,393 issued to Soth; 4,915,770 issued to Haeda et al.; 5,150,787 issued to Bird et al.; 5,268,059 issued to Olson; and 5,213,653 issued to Akahori et al.

Of the above U.S. Patents only U.S. Pat. No. 5,269,059 issued to Olson and U.S. Pat. No. 4,869,393 to Soth are generally similar in purpose to the detaping apparatus of the present invention. However, examination of these patents indicates significant limitations and differences between these devices and the apparatus according to the present invention.

U.S. Pat. No. 4,869,393 to Soth shows a device which is highly complex in construction and in which the actions of feeding and peeling are performed separately. The device includes a guide surface which is moved in a peeling direction. This results in a device which is composed of a relatively large number of complex mechanical components.

U.S. Pat. No. 5,268,059 to Olson shows a device in which the peeling of the cover tape provides a forward motion to the carrier tape and in which a square opening is provided through which the components fall in a direction which is generally parallel to the direction of motion of the tape carrier. This device is suitable for detaping plastic leaded chip carriers, however it cannot be used for small outline package components.

Plastic leaded chip carriers have leads on all four sides of a chip and therefore these components are designed so as to permit the leads to touch each other in a plastic storage tube without damage. The in-line operation of the Olson device therefore has no adverse effect on the plastic leaded chip carrier components however, small outline components have leads only on the opposite edges of a chip. When these components are in a carrier tape the walls of the pockets of the carrier tape serve to protect the leads from touching each other. Small outline packages are designed so that the blank edges touch each other when the components are in a plastic tube and the blank edges of the components are parallel to the longitudinal edges of the carrier tape. The Olson device releases the components in a direction which is in line with the direction of motion of the carrier tape. If a carrier tape containing small outline packages were inserted in the Olson device, the components would be released into the plastic tube in a direction which would allow the leads on adjacent components to become entangled and thereby become damaged.

OBJECTS AND SUMMARY OF THE INVENTION

It is an object of the present invention to provide a detaping apparatus which is capable of automatically removing surface mount electronic components from carrier tapes.

Another object of the present invention is to provide a detaping apparatus which is capable of both removing surface mount electronic components from carrier tapes and automatically inserting the components into plastic tubes.

Another object of the present invention is to provide a detaping apparatus which is capable of detaping and inserting both plastic leaded chip carrier components and small outline package components.

Another object of the present invention is to provide a detaping apparatus which does not require any manual handling of the electronic components during the detaping process.

Another object of the present invention is to provide a detaping apparatus which is capable of removing electronic components from carrier tapes at a relatively high rate of speed.

Another object of the present invention is to provide a detaping apparatus which incorporates a part counter for the purpose of counting the electronic components.

Yet another object of the present invention is to provide a detaping apparatus which includes a relatively small number of component parts resulting in reliable long-term operation and a relatively low manufacturing cost.

In contrast to the prior art, the present invention includes a housing which supports a pair of arms, with a first arm holding a reel which is loaded with a carrier tape holding electronic components which are covered by a cover tape. The second arm holds an empty reel. The housing also includes a rotating drum. During use, the cover tape is attached to the rotating drum. As the drum rotates, the cover tape is peeled from the carrier tape and is rolled onto the rotating drum.

A specially machined cavity member is mounted adjacent to the peel-off location. The cavity member catches the electronic components as they fall out of the carrier tape and the cavity member channels the components to a collection tube under the influence of gravity. The empty carrier tape is then wound onto the empty reel. The direction of motion of the components in the cavity member is perpendicular to the direction of motion of the carrier tape thereby facilitating the detaping of small outline package components.

3

The apparatus can be adjusted to allow the direction of motion of the components in the cavity to be parallel to the direction of motion of the carrier tape for detaping plastic leaded chip carrier components.

The apparatus according to the present invention also includes counters and sensors which are used to program and control the quantity of components to be detaped and inserted into an empty tube. The apparatus is thus able to handle various types of components such as various types of small outline packages as well as plastic leaded chip carrier packages. The apparatus is also able to handle the filling of tubes which require different quantities of components depending on the component types.

BRIEF DESCRIPTION OF THE DRAWINGS

Other important objects and advantages of the invention will be apparent from the following detailed description taken in conjunction with the accompanying drawings in which.

DETAILED DESCRIPTION OF THE INVENTION

Figure 1:
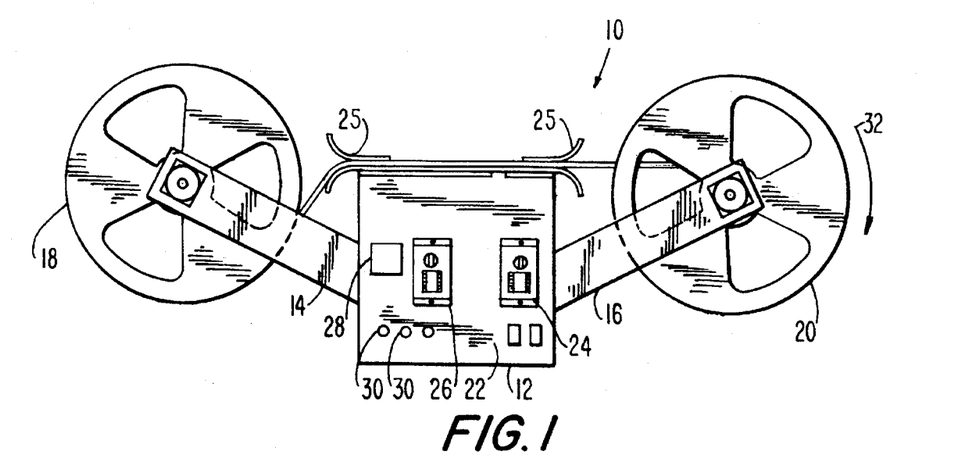
FIG. 1 is a front view of a detaping apparatus in accordance with the present invention.

With reference to the drawings there is shown in FIG. 1 a detaping apparatus 10 which includes a housing 12 which supports a pair of projecting arms 14, 16. A carrier tape reel 18 is mounted on the arm 14 and an empty reel 20 is mounted on the arm 16.

The front panel 22 of the housing 12 includes a pair of motor controllers 24, 26, guide members 25, a counter 28 and on-off switches 30. The motor controller 24 drives the empty reel 20, which functions as a take-up reel, in the direction shown by the arrow 32.

Figure 2:
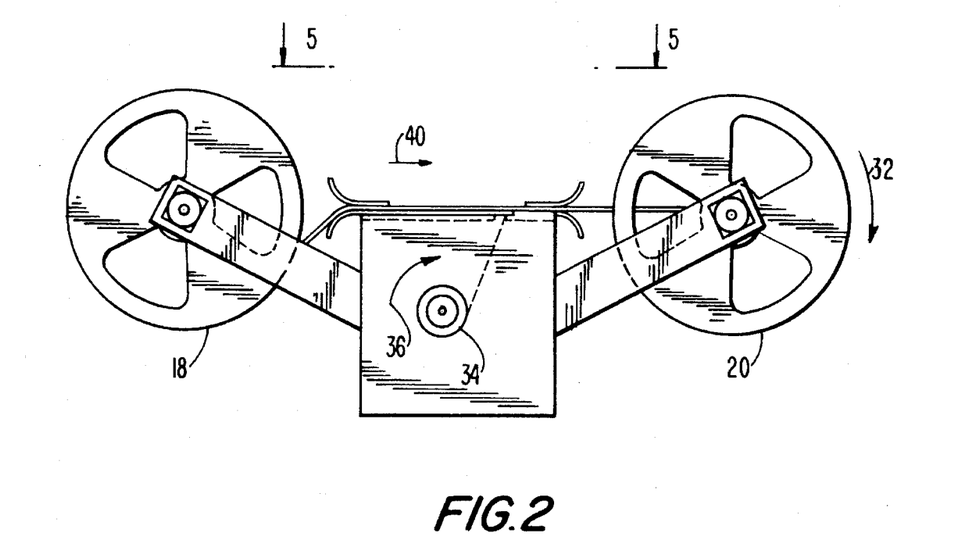
FIG. 2 is a schematic view of the detaping apparatus of FIG. I with the front panel of the housing removed and showing the rotating drum.

FIG. 2 shows a rotating drum 34 which is driven in the direction shown by the arrow 36 by the motor controller 26.

Figure 3:
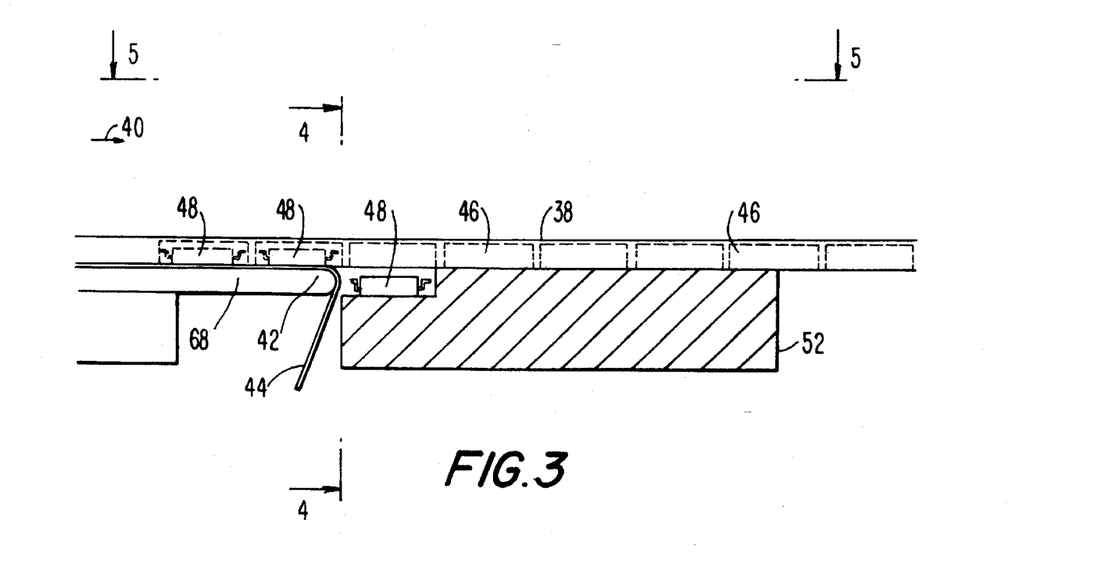
FIG. 3 is a fragmentary cross-sectional view drawn to an enlarged scale showing the cover tape being removed from a carrier tape and an electronic component falling into a channel leading to a tube.
Figure 6:
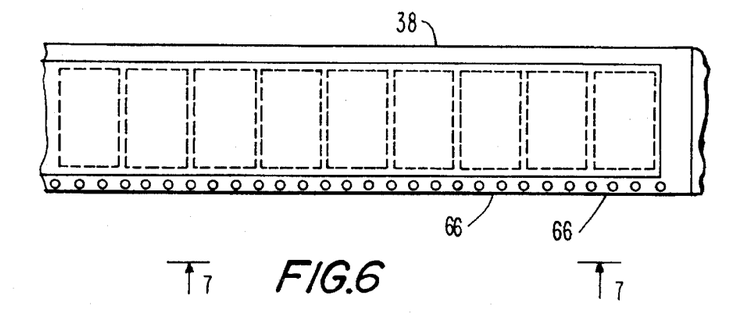
FIG. 6 is a top view of the carrier tape with the carrier tape shown in the "dead bug" position ready for insertion into the detaping apparatus of FIG. 1.
Figure 7:
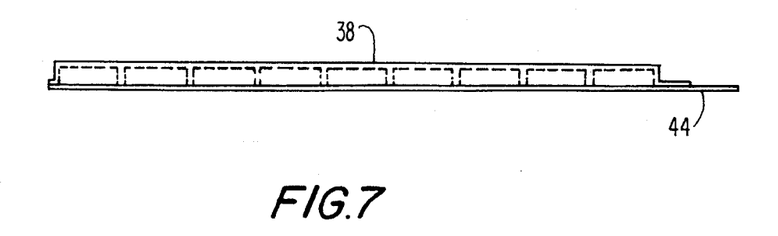
FIG. 7 is a side view of the carrier tape of FIG. 6 taken along the line 7—7 of FIG. 6.
Figure 8:
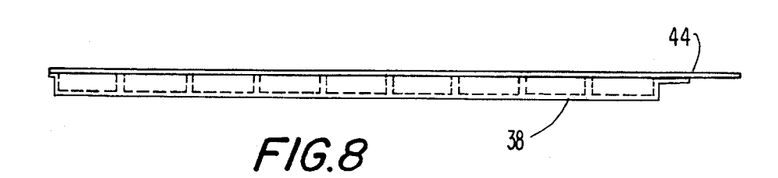
FIG. 8 is a side view of the carrier tape similar to FIG. 7 showing the carrier tape in the "live bug" position with the cover tape uppermost.

As is best shown in FIG. 3, the loaded carrier tape 38, which is in the "dead bug" position as shown in FIGS. 6 and 7, moves in the direction shown by the arrow 40 and as the carrier tape 38 passes the peeling block 4:2, the cover tape 44 is peeled from the carrier tape 38. As is shown in FIG. 3, the cover tape 44 when peeled from the carrier tape 38 moves in a direction that is opposite to the direction of motion of the carrier tape 38.

The loaded carrier tape 38 has a plurality of embossed pockets 46 each of which contains an electronic component 48. The cover tape 44 is typically attached to the carrier tape 38 by a heat sealing process. In the "dead bug" position the carrier tape 38 is uppermost, while in the "live bug" position the cover tape 44 is uppermost.

As the cover tape 44 is peeled from the carrier tape 38 it is wound onto the rotating drum 34. The electronic component 48 falls into a cavity 50 which is formed in the track member 52 which leads to a plastic collection tube 54 into which the electronic component 48 falls.

The rotation of the drum 34 is controlled by an adjustable speed motor 56 which is controlled by the motor controller 26 and which provides a constant time period for the component 48 to fall out of the carrier tape 38 and into the cavity 50. The speed of rotation of the drum 34 can be adjusted to accommodate various sizes of components thereby minimizing the incidence of jamming of components.

Figure 4:
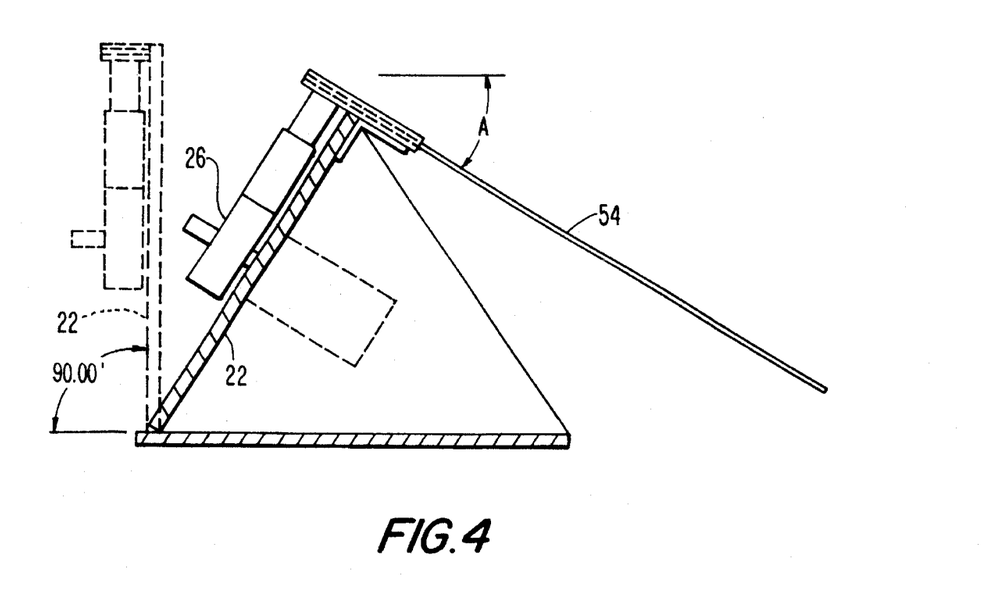
FIG. 4 is a cross-sectional view taken along the line 4—4 of FIG. 3, with an alternative position of the apparatus shown in broken lines.
Figure 5:
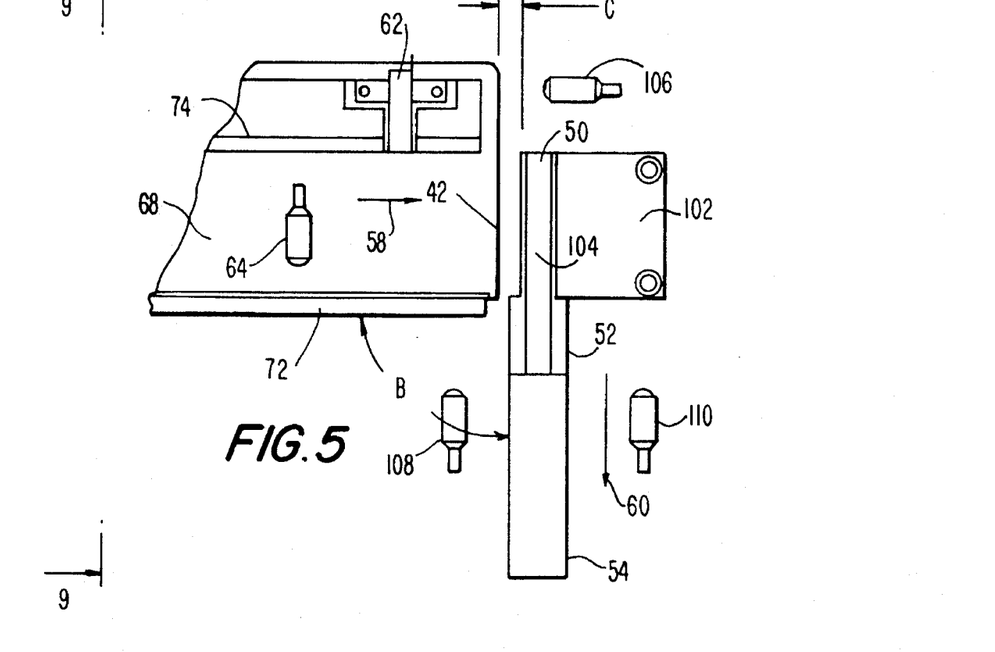
FIG. 5 is a fragmentary top view taken along the line 5—5 of FIG. 2, with the carrier tape removed from the apparatus.

Another key feature of the invention is shown in FIGS. 4 and 5. As is shown in FIG. 4, the carrier tape 38 and the plastic collection tube 54 form an angle with the horizontal which is designated by the letter A. This angle A enables the components 48 to move from the carrier tape 38 to the plastic collection tube 54 under the influence of gravity in an efficient manner. A preferred range for this angle has been found to be 0 degrees to 45 degrees. In addition, as is best shown in FIG. 5, the plastic collection tube 54 forms an angle B with the direction of travel of the carrier tape, as indicated by the arrow 58. The angle B is in the order of ninety degrees which also aids in minimizing the incidence of jamming of components. The direction of motion of the electronic component 48 is shown by the arrow 60 in FIG. 5.

Figure 13:
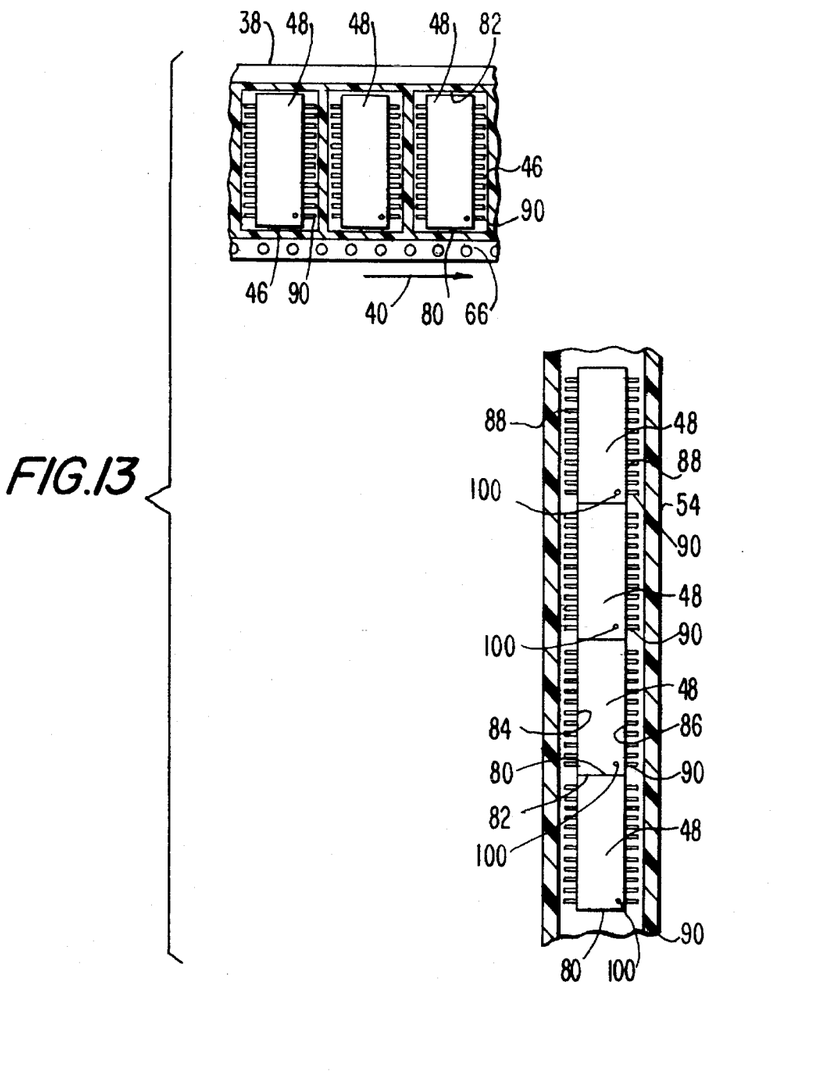
FIG. 13 is a schematic top view showing a plurality of small outline package electronic components in a carrier tape and the same components after they have been inserted into a tube by the detaping apparatus of FIG. 1.

As is shown in FIG. 13 the electronic components 48 which are shown as small-outline package type components each have a front side 80, a rear side 82, and a pair of opposite sides 84, 86 on which the leads 88 are mounted.

As a result of the perpendicular relationship between the direction of travel of the carrier tape 38 and the collection tube 54, the detaping apparatus according to the present invention 10 enables the components 48 to enter the tube 54 with a front side 80 of a component 48 in contact with the rear side 82 of an adjacent component and prevents the engagement and tangling of the lead 88. The detaping apparatus 10 also maintains the orientation of the pins conventionally known as "pin one" 90 of the various components 48 which are indicated by the dots 100.

The detaping apparatus 10 incorporates a controlled distance between the platform 68 and the lower track 102. The distance between the edge 42 of the platform 68, which performs the peeling function, and the lower track 102 which is indicated by the letter C in FIG. 5 can be adjusted in order to accommodate a range of component sizes and to ensure that the current orientation of the components 48 is maintained as they enter the tube 54. A preferred range for this controlled distance C has been found to be in the order of 0.02 inches to 0.10 inches. The height of the platform 68 above the lower track 102 has a controlled distance indicated by the letter D in FIG. 9. A preferred range for this height has been found to be in the order of 0.03 inches to 0.20.

The values of the distances C and D can be adjusted individually.

The lower track has an extremely smooth surface 104 which facilitates sliding of the components 48 without jamming.

Figure 9:
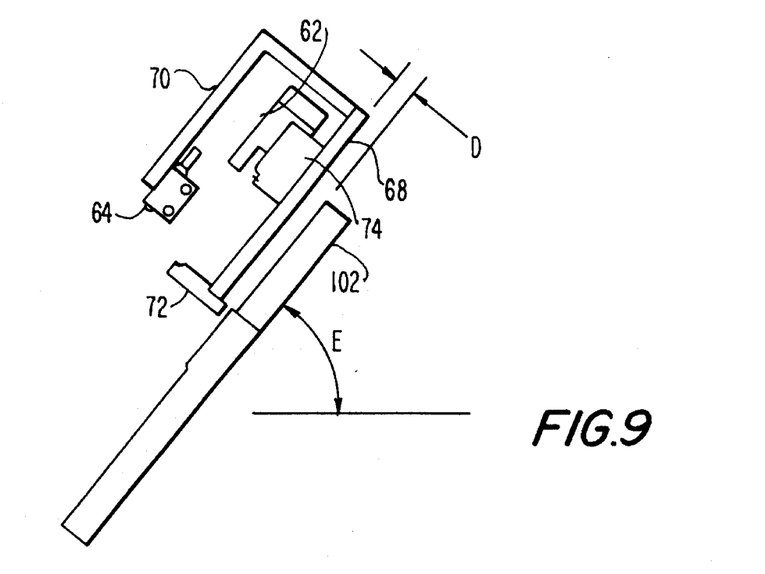
FIG. 9 is a view taken along the line 9—9 of FIG. 5.

The angle between the lower track 102 and the horizontal is indicated by the letter E in FIG. 9. A preferred range for this angle has been found to be in the order of 0 degrees to 45 degrees.

As is best shown in FIGS. 5 and 9, the housing 12 also supports a pair of sensors 62, 64. The sensor 62 is directed at the index holes 66 in the carrier tape 38 while the sensor 64 is directed at the pockets 46 in the carrier tape 38. The two sensors 62, 64 are each connected to an electronic circuit which is conventional in nature and is therefore not shown. The two sensors 62, 64 determine the ratio of the pocket and index holes thereby providing an accurate count of the number of components processed by the detaping apparatus 10.

The sensor 62 is mounted on the rear guide 74 while the sensor 64 is supported above the platform 68 by a bracket 70. The platform 68 includes the front guide bracket 72 and the rear guide bracket 74. The platform 68 and the track 52 are inclined at the same angle as is shown in FIGS. 4 and 9.

The detaping apparatus 10 also includes a jam sensor 106 and a pair of detaped component sensors 108, 110. The following sensors have been found to be effective for use in the detaping apparatus 10. The model numbers of these sensors are presented for illustration only and do not constitute a limitation on the apparatus 10.

This sensor 64 which detects the components in the carrier tape 48 is a through beam SEEKA sensor, Model No. UM-T50DS manufactured by Takena Electronic Industrial Co. Ltd. The sensor 62 which detects index holes 66 in the carrier tape 98 is a slot sensor, Model No. EE-SX672, manufactured by OMRON Corporation. The detaped part sensors 108, 110 is a "through beam" SEEKA sensor, Model No. UM-T5-DT manufactured by Takena Electronic Industrial Co. The jam sensor is a reflective SEEKA sensor, Model No. UM-R5TV manufactured by Takena Electronic Industrial Co.

Figure 10:
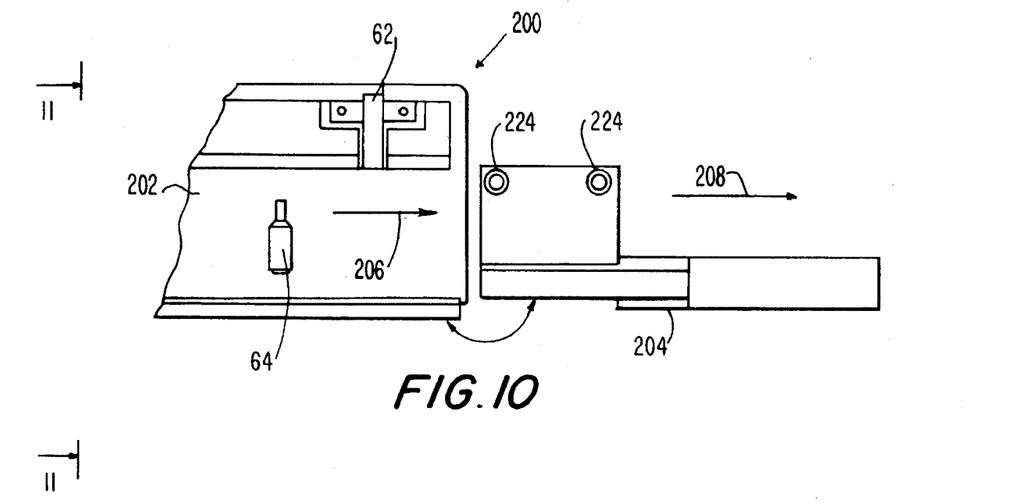
FIG. 10 is a top view of the platform portion of a second embodiment of the invention.
Figure 11:
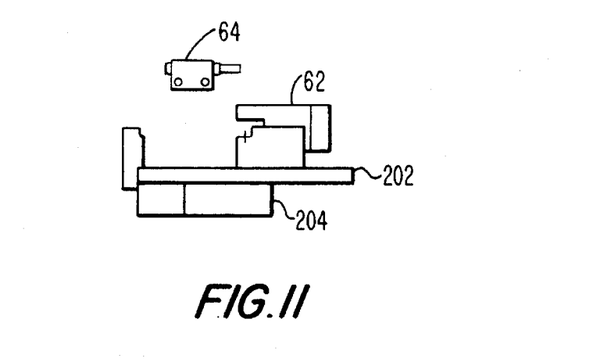
FIG. 11 is a view taken along the line 11 of FIG. 10.
Figure 12:
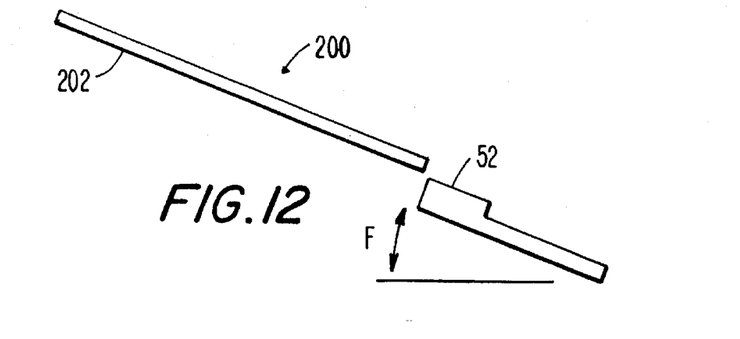
FIG. 12 is a schematic side elevation view of the embodiment of the invention shown in FIG. 10.

In an alternative embodiment of the invention 200 shown in FIGS. 10, 11 and 12, the platform 202 and the track member 52 are both horizontal and the track member 52 is parallel to the direction of motion of the carrier tape 44 as is shown by the arrow 206 in FIG. 10 and the direction of motion of the electronic component is parallel to the direction of motion of the carrier tape 44 as is shown by the arrow 208.

In the embodiment 200 the platform 202 and the track member 52 are both inclined with respect to the horizontal at an angle which is indicated by the letter F in FIG. 12. A preferred range for this angle has been found to be in the order of 10 degrees to 40 degrees. The platform 202 is parallel to the lower track 52 as is shown in FIG. 12.

Figure 14:
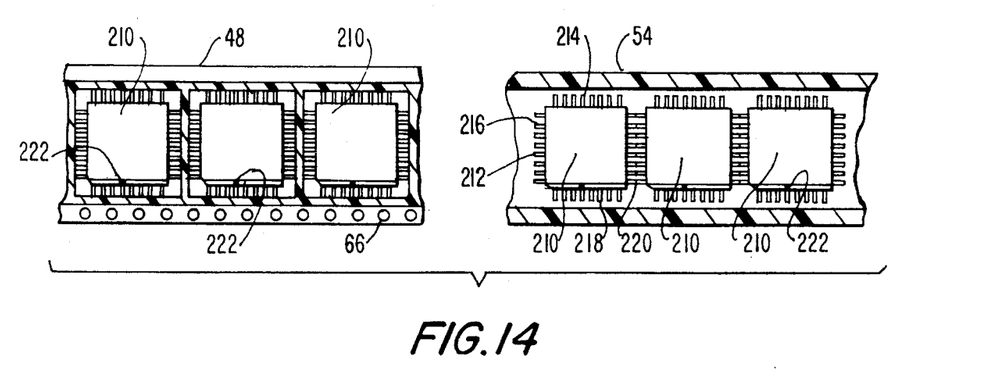
FIG. 14 is a schematic top view showing a plurality of plastic leaded chip carrier components in a carrier tape and the same components after they have been inserted into a tube by the detaping apparatus of FIG. 10.

The embodiment 200 may be used in the detaping of carrier tapes 48 which contain plastic leaded chip carrier components 210 as shown schematically in FIG. 14. The plastic leaded chip carrier components 210 have leads 212 on all four edges 214, 216, 218, 220, and the apparatus 200 according to the present invention prevents jamming of the components 210 and maintains the orientation of the components as indicated by the dot 222.

The lower track 52 can be adjusted from the position shown in FIG. 5 to the position shown in FIG. 10 using the bolts 224 which attach the lower track 52 to the front panel 22, thereby enabling the apparatus 10 to accommodate both small outline package and plastic leaded chip carrier components 212.

Figure 15:
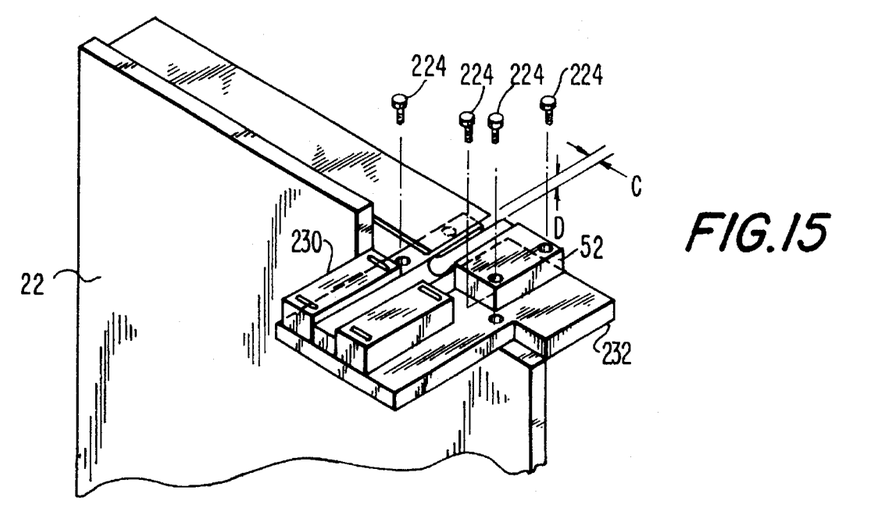
FIG. 15 is a fragmentary perspective view of the apparatus of FIG. 1, drawn to a larger scale.
Figure 16:
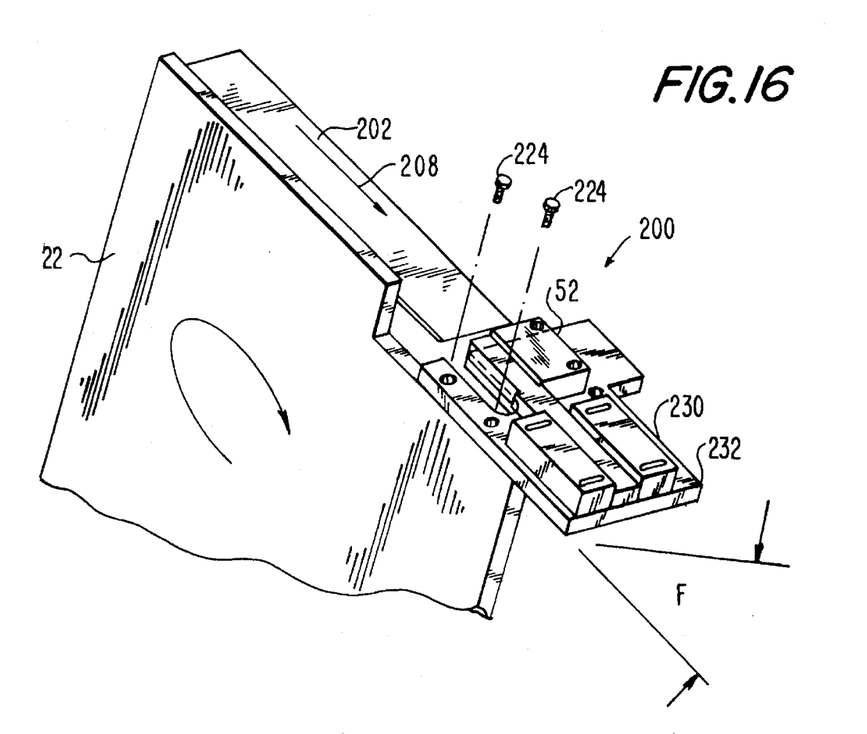
FIG. 16 is a fragmentary perspective view of the second embodiment of the invention shown in FIG. 10 drawn to a larger scale.

The procedure for adjusting the apparatus from the primary embodiment 10 to the alternative embodiment 200 can be best described with reference to FIGS. 15 and 16. As is shown in FIGS. 15 and 16 the lower track 52 and the tube guide 230 are attached to the front panel 22 via the plate 232 and the bolts 224. The bolts 224 may be removed and the plate 232 may be rotated from the position shown in FIG. 15 which corresponds to the position in the primary embodiment 10, as shown in FIG. 5 to the position shown in FIG. 16 which corresponds to the position shown in FIGS. 10, 11 and 12.

In the position shown in FIGS. 12 and 16 which show the alternative embodiment 200, the platform 202 forms an angle with the horizontal which has been designated by the letter F and the front panel 22 has been rotated to the position shown in broken lines in FIG. 4.

In each of the above embodiments 10, 200 a range of different track members 52 can be attached to the platforms 68, 202 in order to accommodate a wide range of electronic component types and sizes, thereby minimizing the incidence of jamming during operation.

The foregoing specific embodiments of the present invention, as set forth in the specification, are for illustrative purposes only. Various changes and modifications may be made within the spirit and scope of the invention.

What is claimed is:

1. A detaping apparatus for detaping electronic components inserted in pockets formed in a carrier tape and covered by a cover tape comprising:

a housing, a first arm member, a second arm member, with said first and said second arm members projecting outwardly from said housing, with said arm members each having an outer end, supply reel means, rotatably mounted on said outer end of said first arm member, take-up reel means rotatably mounted on said outer end of said second arm member, drum means rotatably mounted in said housing, first driving means mounted in said housing and disposed to drive said drum means, second driving means mounted in said housing and disposed to drive said take-up reel, elongated platform means capable of receiving and supporting a carrier tape loaded with electronic components, peel plate means formed on said platform means for peeling said cover tape from said carrier tape, thereby releasing said electronic components, adjustable elongated guide means for receiving said electronic components and capable of a first position in which said adjustable guide means is disposed, substantially perpendicular to said platform means, and a second position in which said adjustable elongated guide means is disposed in substantial alignment with said elongated platform means.

2. A detaping apparatus according to claim 1 further comprising collection tube clamping means disposed on said adjustable elongated guide means.

3. A detaping apparatus according to claim 1 in which said elongated platform means and said adjustable elongated guide means form a common plane.

4. A detaping apparatus according to claim 1 in which said plane formed by said elongated platform means and said adjustable elongated guide means is inclined with respect to the horizontal thereby allowing said electronic components to slide along said adjustable elongated guide means.

5. A detaping apparatus according to claim 1 further comprising sensor means for detecting and counting electronic components moving relative to said elongated platform means.

6. A detaping apparatus according to claim 1 further comprising sensor means for detecting jamming of components on said adjustable elongated guide means.

7. A detaping apparatus according to claim 1 in which said first driving means and said second driving means each comprise electric motor means.

8. A detaping apparatus according to claim 1 in which said drum means is disposed to receive cover tape peeled from said carrier tape.

9. A detaping apparatus according to claim 1 in which said take-up reel means are disposed to receive said carrier tape from which electronic components have been removed.

10. A detaping apparatus according to claim 1 in which said peel plate reverses the direction of motion of said cover tape thereby peeling said cover tape from said carrier tape.

11. A detaping apparatus according to claim 1 in which said driving means further comprises motor controller means.

12. A detaping apparatus according to claim 1 further comprising counter means mounted on said housing.

13. A detaping apparatus according to claim 1 in which said adjustable elongated guide means is disposed spaced apart from said peel plate means a preselected distance.

14. A detaping apparatus according to claim 1 further comprising guide means disposed on said elongated platform means for guiding said carrier tape along said elongated platform means.

15. A detaping apparatus according to claim 1 in which said adjustable elongated guide means further comprises a smooth guide surface.

* * * * *